United States Patent
Fujiwara et al.

(10) Patent No.: US 6,927,011 B2
(45) Date of Patent: Aug. 9, 2005

(54) RESINS FOR RESISTS AND CHEMICALLY AMPLIFIABLE RESIST COMPOSITIONS

(75) Inventors: Tadayuki Fujiwara, Hiroshima (JP);
Yukiya Wakisaka, Hiroshima (JP);
Toru Tokimitsu, Hiroshima (JP);
Naoshi Murata, Hiroshima (JP);
Yoshihiro Kamon, Hiroshima (JP);
Hikaru Momose, Hiroshima (JP)

(73) Assignee: Mitsubishi Rayon Co., Ltd., Tokyo (JP)

( * ) Notice: Subject to any disclaimer, the term of this patent is extended or adjusted under 35 U.S.C. 154(b) by 0 days.

(21) Appl. No.: 10/332,770

(22) PCT Filed: Feb. 9, 2001

(86) PCT No.: PCT/JP01/00946

§ 371 (c)(1),
(2), (4) Date: Jan. 13, 2003

(87) PCT Pub. No.: WO02/04532

PCT Pub. Date: Jan. 17, 2002

(65) Prior Publication Data

US 2003/0148214 A1 Aug. 7, 2003

(30) Foreign Application Priority Data

Jul. 12, 2000 (JP) .................................... 2000-211381

(51) Int. Cl.[7] .................................................. G03F 7/038
(52) U.S. Cl. ............................. 430/270.1; 430/286.1; 430/905; 430/910; 430/326; 526/270
(58) Field of Search ......................... 430/270.1, 286.1, 430/905, 910, 326; 526/270

(56) References Cited

U.S. PATENT DOCUMENTS

| | | | |
|---|---|---|---|
| 5,968,713 A | * 10/1999 | Nozaki et al. | ............. 430/326 |
| 6,080,524 A | 6/2000 | Choi | |
| 6,262,214 B1 | 7/2001 | Yanagase et al. | |
| 6,313,318 B1 | * 11/2001 | Coulson et al. | ............. 549/266 |
| 6,642,346 B2 | * 11/2003 | Brandenburg et al. | ...... 528/310 |
| 2002/0028881 A1 | * 3/2002 | Brandenburg et al. | ...... 525/191 |
| 2002/0155379 A1 | * 10/2002 | Yoon et al. | ............. 430/270.1 |
| 2003/0130414 A1 | * 7/2003 | Brandenburg et al. | ...... 524/592 |

FOREIGN PATENT DOCUMENTS

| | | |
|---|---|---|
| JP | 4-39665 | 2/1992 |
| JP | 10-153864 | 6/1998 |
| JP | 10-207069 | 8/1998 |
| JP | 11-212265 | 8/1999 |
| JP | 2000-26446 | 1/2000 |
| JP | 2000-159758 | 6/2000 |
| JP | 2000-191732 | 7/2000 |
| JP | 2000-241976 | 9/2000 |
| JP | 2001-81139 | 3/2001 |
| WO | 99/50322 | 10/1999 |
| WO | 00/01684 | 1/2000 |

OTHER PUBLICATIONS

U.S. Appl. No. 09/646,117, filed Sep. 27, 2000, Fujiwara et al.
U.S. Appl. No. 10/332,770, filed Jan. 13, 2003, Fukiwara et al.

* cited by examiner

Primary Examiner—Yvette C. Thornton
(74) Attorney, Agent, or Firm—Oblon, Spivak, McClelland, Maier & Neustadt, P.C.

(57) ABSTRACT

A resist resin containing a monomer unit selected from the group comprising a monomer unit represented by Formula (II):

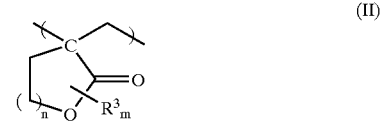

(II)

wherein a substituent $R^3$ represents an alkyl group, or a functional group comprising an acid-deprotectable protecting group, m representing the number of $R^3$ is 0 (non-substitution), 1, 2 or more, $R^3$ may be different from each other, provided that m is 2 or more, and n represents an integer of 0 to 4, has no rough spots on the surface after etching and so has good dry etching resistance, and therefore the resist resin is preferably used as a photo resist for DUV.

9 Claims, No Drawings

US 6,927,011 B2

RESINS FOR RESISTS AND CHEMICALLY AMPLIFIABLE RESIST COMPOSITIONS

TECHNICAL FIELD

The present invention relates to a resist resin and a chemically amplified resist composition, and the present invention particularly relates to a resist resin and a chemically amplified resist composition, which are preferably used in a microfabrication using an excimer laser or electron beam.

BACKGROUND ART

In recent years, a miniaturization has quickly been progressed by the development of a lithographic technique in the field of microfabrication for production of semiconductor devices or liquid crystal devices. As such a microfabrication technique, the conversion of an exposure source into a source with a short wavelength has generally been used. Specifically, previous ultraviolet rays including g-line and i-line as a typical example have been changed to DUV.

Presently, a KrF excimer laser (248 nm) lithographic technique has been introduced in the market, and an ArF excimer laser (193 nm) lithographic technique, which is directed towards the conversion of an exposure source into that with a further shorter wavelength, is being introduced. Moreover, an $F_2$ excimer laser (157 nm) lithographic technique is being studied as a technique for the next generation. Furthermore, an electron beam lithographic technique, which somewhat differs from the above techniques, is also intensively being studied.

As a resist with high resolution for such a light source with a short wavelength or electron beam, a "chemically amplified resist" has been proposed by International Business Machine (IBM) Corporation, and at present, the improvement and development of this chemically amplified resist has vigorously been progressing.

Resins used for resist are also forced to change their structure with the conversion of an exposure source into that with a short wavelength. In the KrF excimer laser lithography, employed is polyhydroxystyrene or polyhydroxystyrene with its hydroxyl group protected with an acid-deprotectable solubility-inhibiting group that is highly transparent to the light at 248 nm. In the ArF excimer laser lithography, it is almost impossible to use the above resin due to insufficient transparency to the light at 193 nm. Accordingly, acryl resins and cycloolefin resins transparent to the light at 193 nm attract attention. Examples of acryl resins include those described in Japanese Patent Laid-Open Nos. 4-39665, 10-207069 and others, and examples of cycloolefin resins include those described in Japanese Patent Laid-Open No. 10-153864 and others.

However, these resins are still insufficient in their performances, and further higher dry etching resistance is required.

As a photoresist for the ArF excimer laser, Japanese Patent Laid-Open No. 11-212265 describes a resin comprising a monomer unit derived from 2-alkyl-2-adamantyl (meth)acrylate and a monomer unit derived from itaconic anhydride, and Japanese Patent Laid-Open No. 2000-26446 describes a resin obtained by (co)polymerization of (meth) acrylate derivatives having polycyclic lactone groups. These publications describe that these resins are excellent in an adhesive property to a substrate and etching resistance, but these are irrelevant to the feature of the present invention.

DISCLOSURE OF THE INVENTION

Accordingly, it is an object of the present invention to provide a resist resin and a chemically amplified resist composition, which have high dry etching resistance and are preferably used in DUV excimer laser lithography or electron beam lithography.

The present inventors have intensively studied on the structure of a resist resin to achieve the above object, they have found that a resist resin and a chemically amplified resist composition, which are preferably used in DUV excimer laser lithography or electron beam lithography, can be obtained by using a resin having a specific structure, thereby completing the present invention.

That is to say, the present invention relates to a resist resin capable of being solubilized in an alkaline solution by the action of an acid, characterized by comprising at least one type of monomer unit selected from the group consisting of monomer units represented by the following Formulas (I) and (II):

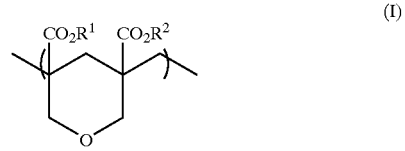

wherein each of $R^1$ and $R^2$ represents a hydrogen atom, alkyl group or acid-deprotectable protecting group, and

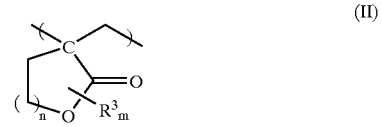

wherein a substituent $R^3$ represents an alkyl group, or a functional group comprising an acid-deprotectable protecting group, m representing the number of $R^3$ is 0 (non-substitution), 1, 2 or more, $R^3$ may be different from each other, provided that m is 2 or more, and n represents an integer of 0 to 4.

Moreover, the chemically amplified resist composition of the present invention comprises this resist resin and a photo acid generator.

Furthermore, the method of forming a pattern of the present invention comprises a step of applying this chemically amplified resist composition on a substrate to be processed, an exposure step and a developing step.

BEST MODE FOR CARRYING OUT THE INVENTION

The present invention will be explained in detail below.

The resist resin of the present invention is capable of being solubilized in an alkaline solution by the action of an acid, and comprises at least one type of monomer unit selected from the group consisting of monomer units represented by the above described Formulas (I) and (II). These monomer units are contained preferably at 0.5 to 40 mole %, and particularly preferably at 1 to 20 mole % in the resin.

In the above described Formula (I), each of $R^1$ and $R^2$ represents a hydrogen atom, alkyl group or acid-deprotectable protecting group. This alkyl group preferably contains 1 to 13 carbon atoms. The acid-deprotectable protecting group means a protecting group which is capable of giving rise to decomposition thereof by the action of an acid, and examples of such a group include a t-butyl group, a tetrahydropyran-2-yl group, a tetrahydrofuran-2-yl group, a 4-methoxytetrahydropyran-4-yl group, a 1-ethoxyethyl group, a 1-butoxyethyl group, a 1-propoxyethyl group, a 3-oxocyclohexyl group, a 2-methyl-2-adamantyl group, a 2-ethyl-2-adamantyl group, a 8-methyl-8-tricyclodecyl group, a 1,2,7,7-tetramethyl-2-norbonyl group, a 2-acetoxymenthyl group, a 2-hydroxymenthyl group, a 1-methyl-1-cyclohexylethyl group and others.

In the above described Formula (II), a substituent $R^3$ represents one, two or more hydrogen atom(s), alkyl group (s), or functional group(s) comprising acid-deprotectable protecting group(s). This alkyl group preferably contains 1 to 13 carbon atoms. Examples of the functional group comprising an acid-deprotectable protecting group include a t-butoxy group, a tetrahydropyran-2-yloxy group, a 1-butoxyethyloxy group, a 2-methyl-2-adamantyloxy group, a menthoxyacetyloxy group, a t-butoxycarbonyl group, a 2-methyl-2-adamantyloxycarbonyl group and others. The n in the above described Formula (II) represents an integer of 0 to 4, and preferably 1 to 3. The substituent $R^3$ binds to a methylene carbon constituting a lactone ring, and m, the number of the substituent $R^3$, is 0, 1, 2 or more. When m is 0, $R^3$ does not exist, and it indicates that a hydrogen atom on a methylene carbon is not substituted. The upper limit of m is 2+2n. When m is 2 or more, $R^3$ may be different from one another. Further, two hydrogen atoms on a single methylene carbon may be substituted by $R^3$. The m is preferably 1 to 2.

The present inventors have found that the direct introduction of cyclic skeletons represented by the above Formulas (I) and (II) into a main chain enables to improve dry etching resistance, and thereby rough spots appearing on the surface of a resist after dry etching are reduced.

The monomer unit of the above described Formula (I) can be contained in the resin by (co)polymerization of monomers such as
di(methyl)-2,2'-[oxybis(methylene)]bis-2-propenoate,
di(ethyl)-2,2'-[oxybis(methylene)]bis-2-propenoate,
di(propyl)-2,2'-[oxybis(methylene)]bis-2-propenoate,
di(isopropyl)-2,2'-[oxybis(methylene)]bis-2-propenoate,
di(butyl)-2,2'-[oxybis(methylene)]bis-2-propenoate,
di(isobutyl)-2,2'-[oxybis(methylene)]bis-2-propenoate,
di(t-butyl)-2,2'-[oxybis(methylene)]bis-2-propenoate,
di(t-amyl)-2,2'-[oxybis(methylene)]bis-2-propenoate,
di(cyclohexyl)-2,2'-[oxybis(methylene)]bis-2-propenoate,
di(isobornyl)-2,2'-[oxybis(methylene)]bis-2-propenoate,
di(adamantyl)-2,2'-[oxybis(methylene)]bis-2-propenoate,
di(2-methyladamantyl)-2,2'-[oxybis(methylene)]bis-2-propenoate, di(tricyclodecanyl)-2,2'-[oxybis(methylene)] bis-2-propenoate,
di(tetrahydropyranyl)-2,2'-[oxybis(methylene)]bis-2-propenoate, di(dicyclopentadienyl)-2,2'-[oxybis (methylene)]bis-2-propenoate and others.
Preferred monomers are
di(t-butyl)-2,2'-[oxybis(methylene)]bis-2-propenoate,
di(2-methyladamantyl)-2,2'-[oxybis(methylene)]bis-2-propenoate, and
di(tricyclodecanyl)-2,2'-[oxybis(methylene)]bis-2-propenoate.

The monomer unit of the above described Formula (II) can be contained in the resin by the (co)polymerization of monomers such as 2-methylene-3-propanolide, 2-methylene-5-pentanolide, 2-methylene-6-hexanolide, 2-methylene-7-heptanolide, 2-methylene-butyrolactone, 4-methyl-2-methylene butyrolactone, 4-ethyl-2-methylene butyrolactone, 2-methylene-4,4-dimethyl-γ-butyrolactone and others. Preferred monomers are 2-methylene-butyrolactone, 4-methyl-2-methylene butyrolactone, 4-ethyl-2-methylene butyrolactone, and 2-methylene-4,4-dimethyl-γ-butyrolactone.

To the resist resin of the present invention, a structure having a functional group which is easily eliminated by the action of acid and a structure having high dry etching resistance are preferably introduced. Examples of other monomer units used to introduce such structures include units for resins which have been known to be used for chemically amplified resist compositions. These units are selected as appropriate depending on the type of a light source used in lithography.

For example, when the KrF excimer laser or electron beam is used as a light source, taking the high etching resistance into consideration, a resin obtained by copolymerization of p-hydroxystyrene or a derivative thereof is preferably used. In such a case, it is essential that the copolymer has, in its structure, a functional group which is eliminated by the action of an acid, allowing solubilization in an alkaline developing solution, so that the copolymer is used as a chemically amplified resist composition.

Specifically, it is preferable that the hydroxyl group of p-hydroxystyrene or the carboxyl group of a monomer to be copolymerized is protected by an acetoxy group, t-butyl group, tetrahydropyranyl group, methyladamantyl group or the like.

When the ArF excimer laser is used as a light source, since the wavelength of the laser is short, a resin obtained by copolymerizing p-hydroxystyrene or a derivative thereof cannot be used because of its low light transmittance. Therefore, taking into consideration balance with etching resistance, a resin having an alicyclic skeleton is preferable.

Specific examples of such a resin include the acryl resin described in Japanese Patent Laid-Open No. 9-090637 or 10-207069, and the olefin resins described in Japanese Patent Laid-Open No. 10-207070 or 10-218941.

Of these, acrylic copolymers obtained by polymerizing a monomer having an alicyclic skeleton and a monomer having a lactone skeleton are particularly preferable as a resin for the ArF excimer laser lithography. The monomer unit having an alicyclic skeleton is contained in the resin preferably at 10 to 90 mole %, and particularly preferably at 30 to 60 mole %. The monomer unit having a lactone skeleton is contained in the resin preferably at 10 to 90 mole %, and particularly preferably at 40 to 70 mole %. It should be noted that the simple description "monomer having a lactone skeleton" is used in the present specification to mean that it does not include the monomer unit of Formula (II).

A monomer having an alicyclic skeleton imparts high dry etching resistance to a copolymer obtained by polymerization and a resin composition thereof, and particularly, a monomer containing a protecting group which is eliminated by the action of an acid can impart high sensitivity to a copolymer and a resin composition thereof used in a lithography using a laser of 193 nm. The monomer having an alicyclic skeleton can be used singly or in combination of two or more types, as necessary.

Such a monomer having an alicyclic skeleton is preferably at least one type selected from the group consisting of cyclohexyl (meth)acrylate, isobornyl (meth)acrylate, adamantyl (meth)acrylate, tricyclodecanyl (meth)acrylate, dicyclopentadienyl (meth)acrylate, and derivatives having substituents such as an alkyl group, a hydroxyl group, a carboxyl group and others on the alicyclic rings of these monomers. Specific examples include 1-isobonyl methacrylate, 2-methacryloyloxy-2-methyladamantane, cyclohexyl methacrylate, adamantyl methacrylate, tricyclodecanyl methacrylate, dicyclopentadienyl methacrylate and others.

A monomer having a lactone skeleton imparts a property of adhering to a substrate to a copolymer obtained by polymerization and a resin composition thereof, and particularly, a monomer containing a protecting group which is eliminated by the action of an acid can impart high sensitivity to a copolymer and a resin composition thereof used in a lithography using a laser of 193 nm. The monomer having a lactone skeleton can be used singly or in combination of two or more types, as necessary.

Such a monomer having a lactone skeleton is preferably at least one type selected from the group consisting of (meth)acrylate having a δ-valerolactone ring, (meth)acrylate having a γ-butyrolactone ring, and derivatives having substituents such as an alkyl group, a hydroxyl group, a carboxyl group and others on the lactone rings of these monomers.

Specific examples include β-methacryloyloxy-β-methyl-δ-valerolactone, β-methacryloyloxy-γ-butyrolactone, β-methacryloyloxy-β-methyl-γ-butyrolactone, α-methacryloyloxy-γ-butyrolactone, 2-(1-methacryloyloxy) ethyl-4-butanolide, pantolactone methacrylate and others.

Moreover, when a resist resin is required to have further higher dry etching resistance, a monomer having a polycyclic lactone ring is preferable as the above described monomer having a lactone skeleton. The term polycyclic lactone ring is used to mean a structure in which a lactone ring is introduced into a polycyclic skeleton such as an isobornyl skeleton, adamantyl skeleton, tricyclodecanyl skeleton or dicyclopentadienyl skeleton. As a monomer having a polycyclic lactone ring, (meth)acrylate having such a polycyclic lactone ring or the like is preferable.

Specific examples include
5-methacryloyloxy-6-hydroxybicyclo[2,2,1]heptane-2-carboxylic-6-lactone, 5-acryloyloxy-6-hydroxybicyclo[2,2,1]heptane-2-carboxylic-6-lactone, 2-methyl-6-methacryloyloxy-6-hydroxybicyclo[2,2,1]heptane-2-carboxylic-6-lactone, 2-methyl-6-acryloyloxy-6-hydroxybicyclo[2,2,1]heptane-2-carboxylic-6-lactone, and others.

The weight-average molecular weight of this resist resin is not particularly limited, but it is preferably within a range of 1,000 to 100,000. As the weight-average molecular weight increases larger, dry etching resistance is improved and thereby the form of the resist pattern becomes better. In contrast, as the weight-average molecular weight decreases, solubility to a resist solvent is improved and resolution is improved.

A simple and preferred method of producing this resist resin is, for example, what is called a drop polymerization method in which a monomer solution obtained by previously dissolving a monomer and a polymerization initiator in an organic solvent, is dropped in an organic solvent kept at a constant temperature.

An organic solvent used in the drop polymerization method is not particularly limited, but a solvent in which both a monomer and the obtained copolymer can be dissolved is preferable, and examples of such an organic solvent include 1,4-dioxane, isopropyl alcohol, acetone, tetrahydrofuran and others.

A polymerization initiator used in the drop polymerization method is not particularly limited, and examples of such a polymerization initiator include azo compounds such as azobisisobutyronitrile and 2,2'-azobis(2,4-dimethylvaleronitrile), organic peroxides such as benzoyl peroxide, and others. Moreover, mercaptans such as n-butyl mercaptan and n-octyl mercaptan may be used in combination as chain transfer agents.

A polymerization temperature in the drop polymerization method is not particularly limited, but the temperature is preferably within a range of 50° C. to 150° C. A dropping time is not particularly limited, but generally the time is 6 hours or longer. It is further preferable that the temperature is kept constant for about 2 hours after completion of dropping to complete polymerization.

A solution of resin solubilized in an alkaline solution by acid, which is produced by the drop polymerization method, is diluted with a good solvent such as tetrahydrofuran or 1,4-dioxane, so that the solution has an appropriate viscosity. Thereafter, the solution is dropped in a large amount of a poor solvent such as heptane, methanol or water for deposition. Thereafter, the deposit is filtrated off and fully dried. This step is called reprecipitation, and it is unnecessary in some cases. However, this step is extremely effective to remove an unreacted monomer remaining in the polymerization solution, a polymerization initiator and the like. If these unreacted products remain as are in the solution, these have a possibility of exerting an adverse effect on the performances of a resist. Accordingly, it is preferable to remove these unreacted products.

The chemically amplified resist composition of the present invention at least comprises the above described resist resin and a photoacid generator. Moreover, when the chemically amplified resist composition is applied on a substrate to be processed, it is dissolved in a solvent and used as a solution. This solvent is appropriately selected depending on purposes. The selection of the solvent is carried out, taking into consideration conditions other than the solubility of a resin, such as homogeneity of a coating film, appearance, safety and others.

Examples of a solvent meeting these conditions include: linear ketones such as 2-pentanone and 2-hexanone; cyclic ketones such as cyclopentanone and cyclohexanone; propylene glycol monoalkyl ether acetates such as propylene glycol monomethyl ether acetate and propylene glycol monoethyl ether acetate; ethylene glycol monoalkyl ether acetates such as ethylene glycol monomethyl ether acetate and ethylene glycol monoethyl ether acetate; propylene glycol monoalkyl ethers such as propylene glycol monomethyl ether and propylene glycol monoethyl ether; ethylene glycol monoalkyl ethers such as ethylene glycol monomethyl ether and ethylene glycol monoethyl ether; diethylene glycol alkyl ethers such as diethylene glycol dimethyl ether and diethylene glycol diethyl ether; esters such as ethyl acetate and ethyl lactate; alcohols such as cyclohexanol and 1-octanol; ethylene carbonate; γ-butyrolactone; and others. These solvents can be used singly or in combination of two or more types. The amount of a solvent used is not particularly limited as long as it is an amount capable of dissolving a resin.

A photo acid generator can appropriately be selected from among acid generators which can be used as those for the chemically amplified resist composition. The photoacid generator can be used singly or in combination of two or more types.

Specific examples of such a photoacid generator include an onium salt compound, a sulfone imide compound, a sulfone compound, a sulfonate compound, a quinone diazide compound, a diazo methane compound and others. Of these, an onium salt compound is preferable, and examples of such an onium salt compound include a sulfonium salt, an iodonium salt, a phosphonium salt, a diazonium salt, a pyridinium salt and others.

Specific examples include triphenylsulfonium triflate, triphenylsulfonium hexafluoroantimonate, triphenylsulfonium naphthalenesulfonate, (hydroxyphenyl) benzylmethylsulfonium toluenesulfonate, diphenyliodonium triflate, diphenyliodonium pyrenesulfonate, diphenyliodonium dodecylbenzenesulfonate, diphenyliodonium hexafluoroantimonate and others.

The amount of a photo acid generator used is appropriately determined depending on the type of the photo acid generator used, but the amount is generally 0.1 to 20 parts by weight, and preferably 0.5 to 10 parts by weight with respect to 100 parts by weight of resist resin. When the amount of a photoacid generator used is too small, there is a risk that it might be difficult to fully carry out a chemical reaction by the catalytic action of acid generated by exposure. On the other hand, when the amount is too large, there is another risk that the stability of a resist composition might be decreased, unevenness might be generated when the composition is applied, or that scum or the like might be generated in a developing step.

The chemically amplified resist composition of the present invention further comprises various additives such as a surfactant, a quencher, a sensitizer, an antihalation agent, a preservative stabilizer or an antifoaming agent, as necessary.

Examples of a surfactant include nonion surfactants such polyoxyethylene lauryl ether and polyethylene glycol dilaurate, as well as surfactants known as the following trade names such as Polyflow No. 75 (produced by Kyoeisha Chemical Co., Ltd.), Magafac F173 (produced by Dainippon Ink and Chemicals Incorporated), Surfion SC-105 (produced by Asahi Glass Co., Ltd.), L-70001 (produced by Nippon Unicar Co., Ltd.) and others.

In a method of forming a pattern which uses such a chemically amplified resist composition, deep UV having a wavelength of 260 nm or shorter (e.g. the KrF excimer laser beam, the ArF excimer laser beam and the $F_2$ excimer laser beam) and an electron beam can be used as exposure sources, and therefore the chemically amplified resist composition can preferably be used in microfabrication of semiconductor substrates such as a silicon wafer. A coating step, an exposure step, a developing step and the like in the pattern formation method can be carried out by known methods.

EXAMPLES

The present invention will further be explained in the following examples. The term "part" is herein used to mean "part by weight", unless otherwise specified.

The measurement of physical properties of a copolymer and the evaluation of a resist were carried out by the following methods.

<Weight-Average Molecular Weight>

The weight-average molecular weight of a resist resin was determined by gel permeation chromatography (GPC) and using polymethyl methacrylate as reference. Chloroform or tetrahydrofuran was used as a solvent.

<Average Copolymer Composition of Copolymers (Mole %)>

The average copolymer composition of a copolymer was obtained by $^1$H-NMR measurement. Heavy chloroform or heavy acetone was used as a solvent.

<Sensitivity>

Post-exposure baking was carried out immediately after a resist film formed on a silicon wafer was subjected to exposure, and then the resist film was developed in an alkaline developing solution, washed with water and dried, so that a resist pattern was formed. Sensitivity was defined as a light exposure forming a line-and-space pattern (L/S=1/1) at a line width of 1/1.

<Resolution>

Resolution is defined as the minimal dimension ($\mu$m) of a resist pattern which is formed when exposure is carried out at the above-described light exposure.

<Dry Etching Resistance>

A resist film formed on a silicon wafer was subjected to etching, and the etching rate of each resist was measured by a reduction in thickness of individual films (normalized by setting the etching rate of a novolac resin as 1). Etching was carried out employing an etch apparatus produced by Tokyo Electron Ltd., using $C_4F_8/Ar/O_2$ mixed gas, under etching conditions at 2,000 W, at 50 mTorr, for 50 seconds.

The surface of a resist was observed with an electron microscope after etching, and a resist having no unevenness on the surface was evaluated with a mark of "○" and a resist having unevenness and roughness on the surface was evaluated with a mark of "×".

Synthesis Example 1

Twenty parts of 1,4-dioxane was placed in a flask equipped with a nitrogen introduction port, an agitator, a condenser and a thermometer in a nitrogen atmosphere, and the temperature of a hot water bath was raised to 80° C. with stirring. A monomer solution obtained by mixing 22.0 parts of p-t-butoxystyrene (abbreviated as PTBST, molecular weight: 176), 13.5 parts of p-hydroxystyrene (abbreviated as HS, molecular weight: 120), 3.7 parts of di(t-butyl)-2,2'-[oxybis(methylene)]bis-2-propenoate (abbreviated as TBED, molecular weight: 298), 62.5 parts of 1,4-dioxane and 1.9 parts of azobisisobutyronitrile was dropped in the flask at a constant rate over 6 hours, and then the temperature of 80° C. was kept for 2 hours. Thereafter, the obtained reaction solution was diluted approximately twice with tetrahydrofuran, and while stirring, the obtained diluted solution was dropped in water in an amount about 10 times the amount of the diluted solution so as to obtain a white precipitate (copolymer A-1). The obtained precipitate was filtrated off and then dried under a reduced pressure at 60° C. for approximately 40 hours.

Subsequently, the physical properties of the obtained copolymer A-1 were measured. The weight-average molecular weight was 9,500 and the composition ratio of the copolymer was PTBST/HS/TBED=50/45/5 mole %.

Synthesis Example 2

Synthesis was carried out in the same manner as in Synthesis example 1 with the exception that 1.6 parts of 2-methylene-4,4-dimethyl-γ-butyrolactone (abbreviated as MDMBL, molecular weight: 126) was used instead of 3.7 parts of di(t-butyl)-2,2'-[oxybis(methylene)]bis-2-propenoate (abbreviated as TBED, molecular weight: 298), so that copolymer A-2 was obtained.

Subsequently, the physical properties of the obtained copolymer A-2 were measured. The weight-average molecular weight was 9,400 and the composition ratio of the copolymer was PTBST/HS/MDMBL=50/45/5 mole %.

Synthesis Example 3

Twenty parts of 1,4-dioxane was placed in a flask equipped with a nitrogen introduction port, an agitator, a condenser and a thermometer in a nitrogen atmosphere, and the temperature of a hot water bath was raised to 80° C. with stirring. A monomer solution obtained by mixing 29.3 parts of 2-methacryloyloxy-2-methyladamantane (abbreviated as MAdMA, molecular weight: 234), 19.1 parts of β-methacryloyloxy-γ-butyrolactone (abbreviated as HGBMA, molecular weight: 170), 3.7 parts of di(t-butyl)-2,2'-[oxybis(methylene)]bis-2-propenoate (abbreviated as TBED, molecular weight: 298), 62.5 parts of 1,4-dioxane and 1.9 parts of azobisisobutyronitrile was dropped in the flask at a constant rate over 6 hours, and then the temperature of 80° C. was kept for 2 hours. Thereafter, the obtained reaction solution was diluted approximately twice with tetrahydrofuran, and while stirring, the obtained diluted solution was dropped in methanol in amount about 10 times the amount of the diluted solution so as to obtain a white precipitate (copolymer A-3). The obtained precipitate was filtrated off and then dried under a reduced pressure at 60° C. for approximately 40 hours.

Subsequently, the physical properties of the obtained copolymer A-3 were measured. The weight-average molecular weight was 9,500 and the composition ratio of the copolymer was MAdMA/HGBMA/TBED=50/45/5 mole %.

Synthesis Example 4

Synthesis was carried out in the same manner as in Synthesis example 3 with the exception that 1.6 parts of 2-methylene-4,4-dimethyl-γ-butyrolactone (abbreviated as MDMBL, molecular weight: 126) was used instead of 3.7 parts of di(t-butyl)-2,2'-[oxybis(methylene)]bis-2-propenoate (abbreviated as TBED, molecular weight: 298), so that copolymer A-4 was obtained.

Subsequently, the physical properties of the obtained copolymer A-4 were measured. The weight-average molecular weight was 9,500 and the composition ratio of the copolymer was MAdMA/HGBMA/MDMBL=50/45/5 mole %.

Synthesis Example 5

Twenty parts of acetonitrile was placed in a flask equipped with a nitrogen introduction port, an agitator, a condenser and a thermometer in a nitrogen atmosphere, and the temperature of a hot water bath was raised to 80° C. with stirring. A monomer solution obtained by mixing 29.3 parts of 2-methacryloyloxy-2-methyladamantane (abbreviated as MAdMA, molecular weight: 234), 24.9 parts of 5-methacryloyloxy-6-hydroxybicyclo[2,2,1]heptane-2-carboxylic-6-lactone (abbreviated as HBHMA, molecular weight: 222), 1.6 parts of 2-methylene-4,4-dimethyl-γ-butyrolactone (abbreviated as MDMBL, molecular weight: 126), 62.5 parts of acetonitrile and 1.9 parts of azobisisobutyronitrile was dropped in the flask at a constant rate over 6 hours, and then the temperature of 80° C. was kept for 2 hours. Thereafter, the obtained reaction solution was diluted approximately twice with acetonitrile, and then, the obtained diluted solution was dropped in methanol in an amount about 10 times the amount of the diluted solution with stirring so as to obtain a white precipitate (copolymer A-5). The obtained precipitate was filtrated off and then dried under a reduced pressure at 60° C. for approximately 40 hours.

Subsequently, the physical properties of the obtained copolymer A-5 were measured. The weight-average molecular weight was 11,000 and the composition ratio of the copolymer was MAdMA/HBHMA/MDMBL=50/45/5 mole %.

Comparative Synthesis Example 1

Twenty parts of 1,4-dioxane was placed in a flask equipped with a nitrogen introduction port, an agitator, a condenser and a thermometer in a nitrogen atmosphere, and the temperature of a hot water bath was raised to 80° C. with stirring. A monomer solution obtained by mixing 22.0 parts of p-t-butoxystyrene (abbreviated as PTBST, molecular weight: 176), 15.0 parts of p-hydroxystyrene (abbreviated as HS, molecular weight: 120), 62.5 parts of 1,4-dioxane and 1.9 parts of azobisisobutyronitrile was dropped in the flask at a constant rate over 6 hours, and then the temperature of 80° C. was kept for 2 hours. Thereafter, the obtained reaction solution was diluted to approximately twice with tetrahydrofuran, and then, the obtained diluted solution was dropped in water in an amount about 10 times the amount of the diluted solution with stirring so as to obtain a white precipitate (copolymer AH-1). The obtained precipitate was filtrated off and then dried under a reduced pressure at 60° C. for approximately 40 hours.

Subsequently, the physical properties of the obtained copolymer AH-1 were measured. The weight-average molecular weight was 12,000 and the composition ratio of the copolymer was PTBST/HS=51/49 mole %.

Comparative Synthesis Example 2

Twenty parts of 1,4-dioxane was placed in a flask equipped with a nitrogen introduction port, an agitator, a condenser and a thermometer in a nitrogen atmosphere, and the temperature of a hot water bath was raised to 80° C. with stirring. A monomer solution obtained by mixing 29.3 parts of 2-methacryloyloxy-2-methyladamantane (abbreviated as MAdMA, molecular weight: 234), 21.2 parts of β-methacryloyloxy-γ-butyrolactone (abbreviated as HGBMA, molecular weight: 170), 62.5 parts of 1,4-dioxane and 1.9 parts of azobisisobutyronitrile was dropped in the flask at a constant rate over 6 hours, and then the temperature of 80° C. was kept for 2 hours. Thereafter, the obtained reaction solution was diluted approximately twice with tetrahydrofuran, and then, the obtained diluted solution was dropped in methanol in an amount about 10 times the amount of the diluted solution with stirring so as to obtain a white precipitate (copolymer AH-2). The obtained precipitate was filtrated off and then dried under a reduced pressure at 60° C. for approximately 40 hours.

Subsequently, the physical properties of the obtained copolymer AH-2 were measured. The weight-average molecular weight was 11,000 and the composition ratio of the copolymer was MAdMA/HGBMA=50/50 mole %.

Comparative Synthesis Example 3

Twenty parts of acetonitrile was placed in a flask equipped with a nitrogen introduction port, an agitator, a condenser and a thermometer in a nitrogen atmosphere, and the temperature of a hot water bath was raised to 80° C. with stirring. A monomer solution obtained by mixing 29.3 parts of 2-methacryloyloxy-2-methyladamantane (abbreviated as MAdMA, molecular weight: 234), 27.8 parts of 5-methacryloyloxy-6-hydroxybicyclo[2,2,1]heptane-2-carboxylic-6-lactone (abbreviated as HBHMA, molecular weight: 222), 62.5 parts of acetonitrile and 1.9 parts of azobisisobutyronitrile was dropped in the flask at a constant rate over 6 hours. During dropping, an insoluble precipitate was generated in the polymerization solvent. Then, the temperature of 80° C. was kept for 2 hours. Thereafter, the obtained heterogeneous reaction solution was diluted approximately twice with acetonitrile, and then, the obtained diluted solution was dropped in methanol in an amount about 10 times the amount of the diluted solution with stirring so as to obtain a white precipitate (copolymer AH-3).

The obtained precipitate was filtrated off and then dried under a reduced pressure at 60° C. for approximately 40 hours.

Subsequently, the physical properties of the obtained copolymer AH-3 were measured. The weight-average molecular weight was 12,000 and the composition ratio of the copolymer was MAdMA/HBHMA=52/48 mole %.

Examples 1 to 5 and Comparative Examples 1 to 3

The ingredients of individual examples and comparative examples shown in Table 1 were mixed to obtain a homogeneous solution for each example or comparative example, and the obtained solution was then filtrated through a membrane filter having a pore size of 0.1 μm so as to prepare a resist composition solution. Thereafter, each composition solution was spincoated on a silicon wafer, and thereafter, pre-baking was carried out using a hot plate at 120° C. for 60 seconds to form a resist film having a film thickness of 0.5 μm. Subsequently, resist films of Examples 1 and 2 and Comparative example 1 were exposed using the KrF excimer laser exposure equipment, whereas resist films of Examples 3 to 5 and Comparative example 2 were exposed using the ArF excimer laser exposure equipment. Then, post-exposure baking was carried out at 120° C. for 60 seconds using a hot plate. Thereafter, development was carried out at room temperature using a 2.38 weight % tetramethylammonium hydroxide solution followed by washing with pure water and drying, so as to form a resist pattern. The evaluation results of the obtained resist patterns are shown in Tables 2 and 3. Moreover, the results obtained by measuring the etching rate of each resist under the above described conditions are also shown in Tables 2 and 3.

With regard to the copolymer AH-3 in Comparative synthesis example 3 (Comparative example 3), the resist solution was intended to be prepared as mentioned above, but the copolymer did not dissolve in the solvent, and therefore the resist performances could not be evaluated.

Thus, in the above examples, sensitivity and resolution were not significantly decreased, and dry etching resistance was improved, so that rough spots were not generated on the surface of a resist after etching. In contrast, in comparative examples, dry etching resistance was not sufficient, and so rough spots were generated on the surface of a resist after etching.

TABLE 1

|  | Copolymer (part) | Photo acid generator (part) | Solvent [Note 1] (part) |
|---|---|---|---|
| Example 1 | A-1 (100) | B-1 (2) | 500 |
| Example 2 | A-2 (100) | B-1 (2) | 500 |
| Example 3 | A-3 (100) | B-1 (2) | 500 |
| Example 4 | A-4 (100) | B-1 (2) | 500 |
| Example 5 | A-5 (100) | B-1 (2) | 500 |
| Comparative example 1 | AH-1 (100) | B-1 (2) | 500 |
| Comparative example 2 | AH-2 (100) | B-1 (2) | 500 |

[Note 1] Propylene glycol monomethyl ether acetate
B-1: Triphenyl sulfonium triflate

TABLE 2

|  | Sensitivity (mJ/cm$^2$) | Resolution (μm) | Etching rate [Note 1] | Roughness on surface after etching [Note 2] |
|---|---|---|---|---|
| Example 1 | 10.0 | 0.35 | 1.12 | ○ |
| Example 2 | 12.1 | 0.36 | 1.13 | ○ |
| Comparative example 1 | 10.1 | 0.35 | 1.20 | X |

[Note 1] Normalized by setting etching rate of novolac resin as 1
[Note 2] ○: Not rough, X: Rough

TABLE 3

|  | Sensitivity (mJ/cm$^2$) | Resolution (μm) | Etching rate [Note 1] | Roughness on surface after etching [Note 2] |
|---|---|---|---|---|
| Example 3 | 4.0 | 0.16 | 1.14 | ○ |
| Example 4 | 4.5 | 0.17 | 1.15 | ○ |
| Example 5 | 5.0 | 0.17 | 1.05 | ○ |
| Comparative example 2 | 3.6 | 0.16 | 1.26 | X |

[Note 1] Normalized by setting etching rate of novolac resin as 1
[Note 2] ○: Not Rough, X: Rough

INDUSTRIAL APPLICABILITY

The resist resin and the chemically amplified resist composition of the present invention have no rough spots on the resist surface after etching and have good dry etching resistance as well as high sensibility and resolution, and accordingly these resist resin and chemically amplified resist composition can stably form a high-precision fine resist pattern. Therefore, the resist resin and the chemically amplified resist composition of the present invention can preferably be used in a DUV excimer laser lithography or electron beam lithography, and particularly in a lithography using the ArF excimer laser.

What is claimed is:

1. A resist resin capable of being solubilized in an alkaline solution by the action of an acid, comprising a monomer unit represented by the following formula (II):

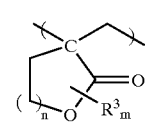

(II)

wherein a substituent $R^3$ represents an alkyl group, or a functional group comprising an acid-deprotectable protecting group, m representing the number of $R^3$ is 0 (non-substitution), 1, 2 or more, $R^3$ may be different from one another, provided that m is 2 or more, and n represents an integer of 0 to 4;
a monomer unit having an alicyclic skeleton; and
a monomer unit having a lactone skeleton, excluding the monomer unit of Formula (II).

2. The resist resin according to claim 1, wherein the monomer unit having an alicyclic skeleton is at least one type selected from the group consisting of cyclohexyl (meth)acrylate, isobornyl (meth)acrylate, adamantyl (meth)acrylate, tricyclodecanyl (meth)acrylate, dicyclopentadienyl (meth)acrylate, and derivatives having at least one substituent on the alicyclic rings.

3. The resist resin according to claim 2, wherein the monomer unit having a lactone skeleton is at least one type selected from the group consisting of (meth)acrylate having a δ-valerolactone ring, (meth)acrylate having a γ-butyrolactone ring, derivatives having at least one substituent on the δ-valerolactone ring and derivatives having at least one substituent on the γ-butyrolactone ring.

4. The resist resin according to claim 2, wherein the monomer unit having a lactone skeleton is at least one type selected from the group consisting of (meth)acrylate having a polycyclic lactone ring and derivatives having at least one substituent on the polycyclic lactone ring.

5. The resist resin according to claim 1, wherein the monomer unit having a lactone skeleton is at least one type selected from the group consisting of (meth)acrylate having a δ-valerolactone ring, (meth)acrylate having a γ-butyrolactone ring, derivatives having at least one substituent on the δ-valerolactone ring and derivatives having at least one substituent on the γ-butyrolactone ring.

6. The resist resin according to claim 1, wherein the monomer unit having a lactone skeleton is at least one type selected from the group consisting of (meth)acrylate having a polycyclic lactone ring and derivatives having at least one substituent on the polycyclic lactone ring.

7. A chemically amplified resist composition comprising the resist resin according to claim 1 and a photo acid generator.

8. A method of forming a pattern, comprising applying the chemically amplified resist composition according to claim 7 on a substrate to be processed, exposing said resist composition with an exposure source, and developing said exposed resist composition.

9. The method of forming a pattern according to claim 8, wherein the exposure source is selected from the group consisting of KrF excimer laser beam, ArF excimer laser beam, $F_2$ excimer laser beam and an electron beam.

* * * * *